(12) United States Patent
Lee et al.

(10) Patent No.: US 11,910,650 B2
(45) Date of Patent: Feb. 20, 2024

(54) DISPLAY DEVICE INCLUDING FIRST HIGH PERMITTIVITY INSULATION LAYER ON FIRST ACTIVE PATTERN

(71) Applicant: Samsung Display Co., Ltd., Yongin-si (KR)

(72) Inventors: Jin Woo Lee, Suwon-si (KR); Jintaek Kim, Yongin-si (KR); Yeonhong Kim, Hwaseong-si (KR); Pilsuk Lee, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 158 days.

(21) Appl. No.: 17/510,040

(22) Filed: Oct. 25, 2021

(65) Prior Publication Data
US 2022/0045152 A1 Feb. 10, 2022

Related U.S. Application Data

(63) Continuation of application No. 16/706,597, filed on Dec. 6, 2019, now Pat. No. 11,158,697.

(30) Foreign Application Priority Data

Mar. 14, 2019 (KR) .................. 10-2019-0029545

(51) Int. Cl.
*H10K 59/12* (2023.01)
*H10K 59/121* (2023.01)
(Continued)

(52) U.S. Cl.
CPC ....... *H10K 59/1216* (2023.02); *H10K 59/124* (2023.02); *H10K 77/111* (2023.02)

(58) Field of Classification Search
CPC ............. H01L 27/3265; H01L 27/3258; H01L 51/0097
(Continued)

(56) References Cited

U.S. PATENT DOCUMENTS

2002/0104995 A1* 8/2002 Yamazaki ............ H10K 59/122
257/E27.113
2007/0007524 A1 1/2007 You et al.
(Continued)

FOREIGN PATENT DOCUMENTS

| CN | 107004722 A | * | 8/2017 | ............. C23C 14/08 |
| JP | 2002-124678 A | | 4/2002 | |
| JP | 2018-190753 A | | 11/2018 | |

OTHER PUBLICATIONS

Li, Flora, M., et al., High-density remote plasma sputtering of high-dieletric-constant amorphous hafnium oxide films, Physica Status Solidi B, Basic Research, vol. 250, No. 5, May 1, 2013, pp. 957-967.

(Continued)

*Primary Examiner* — Phuc T Dang
(74) *Attorney, Agent, or Firm* — Lewis Roca Rothgerber Christie LLP

(57) ABSTRACT

A display device includes: a substrate; a buffer layer on the substrate; a first active pattern and a second active pattern on the buffer layer and spaced apart from each other; a first gate insulation layer on the first active pattern and the second active pattern; a first gate electrode and a second gate electrode on the first gate insulation layer, the first gate electrode and the second gate electrode respectively overlapping the first active pattern and the second active pattern; a second gate insulation layer on the first gate electrode and the second gate electrode; and a capacitor electrode on the second gate insulation layer, the capacitor electrode overlapping the first gate electrode, wherein a permittivity of the first gate insulation layer is greater than a permittivity of the buffer layer.

13 Claims, 10 Drawing Sheets

(51) Int. Cl.
H10K 59/124 (2023.01)
H10K 77/10 (2023.01)

(58) Field of Classification Search
USPC .......................................................... 257/71
See application file for complete search history.

(56) References Cited

U.S. PATENT DOCUMENTS

| | | | |
|---|---|---|---|
| 2008/0296998 A1* | 12/2008 | Hano | B41J 2/1642 |
| | | | 310/300 |
| 2012/0025196 A1 | 2/2012 | Wada et al. | |
| 2012/0146713 A1 | 6/2012 | Kim et al. | |
| 2013/0264624 A1 | 10/2013 | Ishida et al. | |
| 2014/0332771 A1* | 11/2014 | Byun | H10K 59/1216 |
| | | | 257/40 |
| 2014/0361261 A1* | 12/2014 | Choi | H10K 50/818 |
| | | | 438/23 |
| 2015/0108484 A1 | 4/2015 | Park et al. | |
| 2016/0141346 A1* | 5/2016 | You | H01L 29/66772 |
| | | | 257/40 |
| 2016/0190221 A1 | 6/2016 | Cho et al. | |
| 2016/0233288 A1* | 8/2016 | Lee | H10K 59/1213 |
| 2016/0260926 A1 | 9/2016 | Kim et al. | |
| 2016/0351643 A1 | 12/2016 | Xie | |
| 2017/0141175 A1 | 5/2017 | Park et al. | |
| 2017/0194401 A1 | 7/2017 | Cho et al. | |
| 2017/0330929 A1 | 11/2017 | Park | |
| 2018/0090617 A1 | 3/2018 | Youn et al. | |
| 2018/0122886 A1 | 5/2018 | Kim et al. | |
| 2018/0145125 A1 | 5/2018 | Lee et al. | |
| 2018/0286938 A1* | 10/2018 | Moon | H10K 77/111 |
| 2018/0322826 A1 | 11/2018 | Lee et al. | |
| 2019/0129539 A1 | 5/2019 | Kim et al. | |
| 2020/0066766 A1 | 2/2020 | Chen | |

OTHER PUBLICATIONS

Japanese Office Action dated May 30, 2023, issued in corresponding Japanese Patent Application No. 2019-219352 (7 pages).

* cited by examiner

DISPLAY DEVICE INCLUDING FIRST HIGH PERMITTIVITY INSULATION LAYER ON FIRST ACTIVE PATTERN

CROSS-REFERENCE TO RELATED APPLICATIONS

This application is a continuation of U.S. patent application Ser. No. 16/706,597, filed Dec. 6, 2019, now U.S. Pat. No. 11,158,697, which claims priority to and the benefit of Korean Patent Application No. 10-2019-0029545, filed Mar. 14, 2019, the entire content of both of which is incorporated herein by reference.

BACKGROUND

1. Field

Aspects of some example embodiments relate to a display device.

2. Description of the Related Art

Recently, flat panel display devices such as liquid crystal display devices, plasma display devices, organic light emitting display devices, field emission display devices, electrophoretic display devices, etc. are widely used. The organic light emitting display device is a self-luminous display device, and unlike the liquid crystal display device, the organic light emitting display device may not utilize separate light sources, and thus, thickness and weight can be reduced. Moreover, the organic light emitting display device exhibits high quality characteristics such as relatively low power consumption, relatively high luminance, relatively fast response speeds, and the like, and thus are being highlighted as a next generation display device.

An area of a pixel decreases as a definition of the organic light emitting display device increases. When the area of the pixel decreases, an area for forming a driving transistor may be reduced, thus, a driving range of the driving transistor may be reduced. Afterimage, image sticking, flicker, etc. may occur in the organic light emitting display device.

The above information disclosed in this Background section is only for enhancement of understanding of the background and therefore the information discussed in this Background section does not necessarily constitute prior art.

SUMMARY

Aspects of some example embodiments relate to a display device. For example, some example embodiments relate to a display device that includes an insulation layer having a relatively high permittivity.

Some example embodiments include a display device that includes a transistor having improved characteristics.

Some example embodiments include a display device in which image retention is reduced.

According to some example embodiments of the present disclosure, a display device includes: a substrate, a buffer layer on the substrate, a first active pattern and a second active pattern on the buffer layer and spaced apart from each other, a first gate insulation layer on the first active pattern and the second active pattern, a first gate electrode and a second gate electrode on the first gate insulation layer, the first gate electrode and the second gate electrode respectively overlapping the first active pattern and the second active pattern, a second gate insulation layer on the first gate electrode and the second gate electrode, and a capacitor electrode on the second gate insulation layer, the capacitor electrode overlapping the first gate electrode. A permittivity of the first gate insulation layer may be greater than a permittivity of the buffer layer.

According to some example embodiments, the first gate insulation layer may include an inorganic insulation layer and a high permittivity insulation layer having a permittivity greater than that of the inorganic insulation layer.

According to some example embodiments, the first gate insulation layer may include a first high permittivity insulation layer and an inorganic insulation layer on the first high permittivity insulation layer and having a permittivity less than that of the first high permittivity insulation layer.

According to some example embodiments, the first high permittivity insulation layer may be patterned to overlap the first active pattern.

According to some example embodiments, a thickness of the first high permittivity insulation layer may be less than a thickness of the inorganic insulation layer.

According to some example embodiments, the first gate insulation layer may further include a second high permittivity insulation layer on the inorganic insulation layer and having a permittivity greater than that of the inorganic insulation layer.

According to some example embodiments, the second high permittivity insulation layer may be patterned to overlap the second active pattern.

According to some example embodiments, a thickness of the second high permittivity insulation layer may be less than a thickness of the inorganic insulation layer.

According to some example embodiments, the first gate insulation layer may include at least one of zirconium oxide ($ZrO_2$), hafnium oxide ($HfO_2$), tantalum oxide ($Ta_2O_5$), or niobium oxide ($Nb_2O_5$).

According to some example embodiments, a permittivity of the second gate insulation layer may be greater than the permittivity of the buffer layer.

According to some example embodiments, the second gate insulation layer may include an inorganic insulation layer and a high permittivity insulation layer having a permittivity greater than that of the inorganic insulation layer.

According to some example embodiments, the display device may further include a high permittivity insulation layer between the substrate and the buffer layer, the high permittivity insulation layer having a permittivity greater than that of the buffer layer.

According to some example embodiments, the substrate may include a plastic.

According to some example embodiments, the display device may further include an insulation interlayer on the capacitor electrode and a source electrode and a drain electrode on the insulation interlayer and connected to the first active pattern with passing through the first gate insulation layer, the second gate insulation layer, and the insulation interlayer. The permittivity of the first gate insulation layer may be greater than a permittivity of the insulation interlayer.

According to some example embodiments, the display device may further include a planarization layer on the source electrode and the drain electrode, a first electrode on the planarization layer and connected to the drain electrode with passing through the planarization layer, an emission layer on the first electrode, and a second electrode on the emission layer.

According to some example embodiments of the present disclosure, a display device include: a substrate, a buffer layer on the substrate, a first active pattern and a second active pattern on the buffer layer and spaced apart from each other, a first gate insulation layer on the first active pattern and the second active pattern, a first gate electrode and a second gate electrode on the first gate insulation layer, the first gate electrode and the second gate electrode respectively overlapping the first active pattern and the second active pattern, a second gate insulation layer on the first gate electrode and the second gate electrode, and a capacitor electrode on the second gate insulation layer, the capacitor electrode overlapping the first gate electrode. A permittivity of the second gate insulation layer may be greater than a permittivity of the buffer layer.

According to some example embodiments, the second gate insulation layer may include an inorganic insulation layer and a high permittivity insulation layer having a permittivity greater than that of the inorganic insulation layer.

According to some example embodiments, the high permittivity insulation layer may be on the inorganic insulation layer.

According to some example embodiments, the high permittivity insulation layer may be patterned to overlap the first gate electrode.

According to some example embodiments, a thickness of the high permittivity insulation layer may be less than a thickness of the inorganic insulation layer.

According to some example embodiments, the second gate insulation layer may include at least one of zirconium oxide ($ZrO_2$), hafnium oxide ($HfO_2$), tantalum oxide ($Ta_2O_5$), or niobium oxide ($Nb_2O_5$).

According to some example embodiments, the display device may further include a high permittivity insulation layer between the substrate and the buffer layer, the high permittivity insulation layer having a permittivity greater than that of the buffer layer.

According to some example embodiments, the substrate may include a plastic.

According to some example embodiments of the present disclosure, a display device includes: a substrate, a high permittivity insulation layer on the substrate, a buffer layer on the high permittivity insulation layer, a first active pattern and a second active pattern on the buffer layer and spaced apart from each other, a first gate insulation layer on the first active pattern and the second active pattern, a first gate electrode and a second gate electrode on the first gate insulation layer, the first gate electrode and the second gate electrode respectively overlapping the first active pattern and the second active pattern, a second gate insulation layer on the first gate electrode and the second gate electrode, and a capacitor electrode on the second gate insulation layer, the capacitor electrode overlapping the first gate electrode. A permittivity of the high permittivity insulation layer may be greater than a permittivity of the buffer layer.

According to some example embodiments, a density of the high permittivity insulation layer may be greater than a density of the buffer layer.

According to some example embodiments, the substrate may include a plastic.

According to some example embodiments, the substrate may have a multilayer structure including a first organic layer, a second organic layer on the first organic layer, and an inorganic layer between the first organic layer and the second organic layer.

According to some example embodiments, the substrate may have a single-layer structure including an organic layer.

According to some example embodiments, the high permittivity insulation layer may include at least one of zirconium oxide ($ZrO_2$), hafnium oxide ($HfO_2$), tantalum oxide ($Ta_2O_5$), or niobium oxide ($Nb_2O_5$).

According to some example embodiments, the display device may further include a barrier layer between the high permittivity insulation layer and the buffer layer.

The display device according to some example embodiments may include the gate insulation layer having a relatively high permittivity and between the active pattern and the gate electrode of each of the transistors. Accordingly, a driving range of the driving transistor may increase, and a driving speed of the switching transistor may increase.

The display device according to some example embodiments may include the insulation layer having a relatively high permittivity and between the electrodes of the capacitor. Accordingly, afterimage and flicker of the display device may be reduced.

The display device according to some example embodiments may include the high permittivity insulation layer having a relatively high permittivity and between the substrate and the buffer layer. Accordingly, image sticking of the display device may be reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, display devices in accordance with some example embodiments will be explained in more detail with reference to the accompanying drawings.

Figure 1:
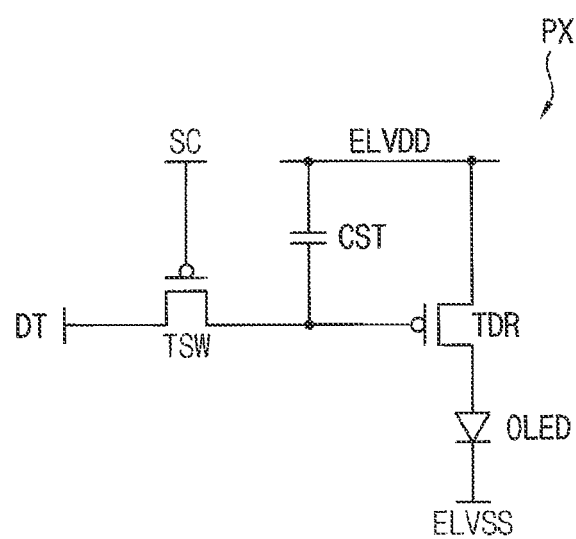
FIG. 1 is a circuit diagram illustrating a pixel included in a display device according to some example embodiments.

FIG. 1 is a circuit diagram illustrating a pixel included in a display device according to some example embodiments.

Referring to FIG. 1, a display device according to some example embodiments may include a plurality of pixels PX. Each of the pixels PX may include a driving transistor TDR, a switching transistor TSW, a storage capacitor CST, and an organic light emitting diode OLED.

A gate electrode of the driving transistor TDR may be electrically connected to a drain electrode of the switching transistor TSW and a first electrode of the storage capacitor CST. A source electrode of the driving transistor TDR may receive a driving voltage ELVDD, and a drain electrode of the driving transistor TDR may be electrically connected to an anode of the organic light emitting diode OLED. The driving transistor TDR may receive a data signal DT from the switching transistor TSW, and may supply a driving current to the organic light emitting diode OLED.

A gate electrode of the switching transistor TSW may receive a scan signal SC. A source electrode of the switching transistor TSW may receive the data signal DT, and the drain electrode of the switching transistor TSW may be electrically connected to the gate electrode of the driving transistor TDR. The switching transistor TSW may be turned-on in response to the scan signal SC, and may transmit the data signal DT to the gate electrode of the driving transistor TDR.

The first electrode of the storage capacitor CST may be electrically connected to the gate electrode of the driving transistor TDR, and a second electrode of the storage capacitor CST may receive the driving voltage ELVDD. The storage capacitor CST may maintain a voltage between the gate electrode and the source electrode of the driving transistor TDR when the switching transistor TSW is turned-off.

The anode of the organic light emitting diode OLED may be electrically connected to the drain electrode of the driving transistor TDR, and a cathode of the organic light emitting diode OLED may receive a common voltage ELVSS. The organic light emitting diode OLED may emit light based on the driving current supplied from the driving transistor TDR.

Figure 2:
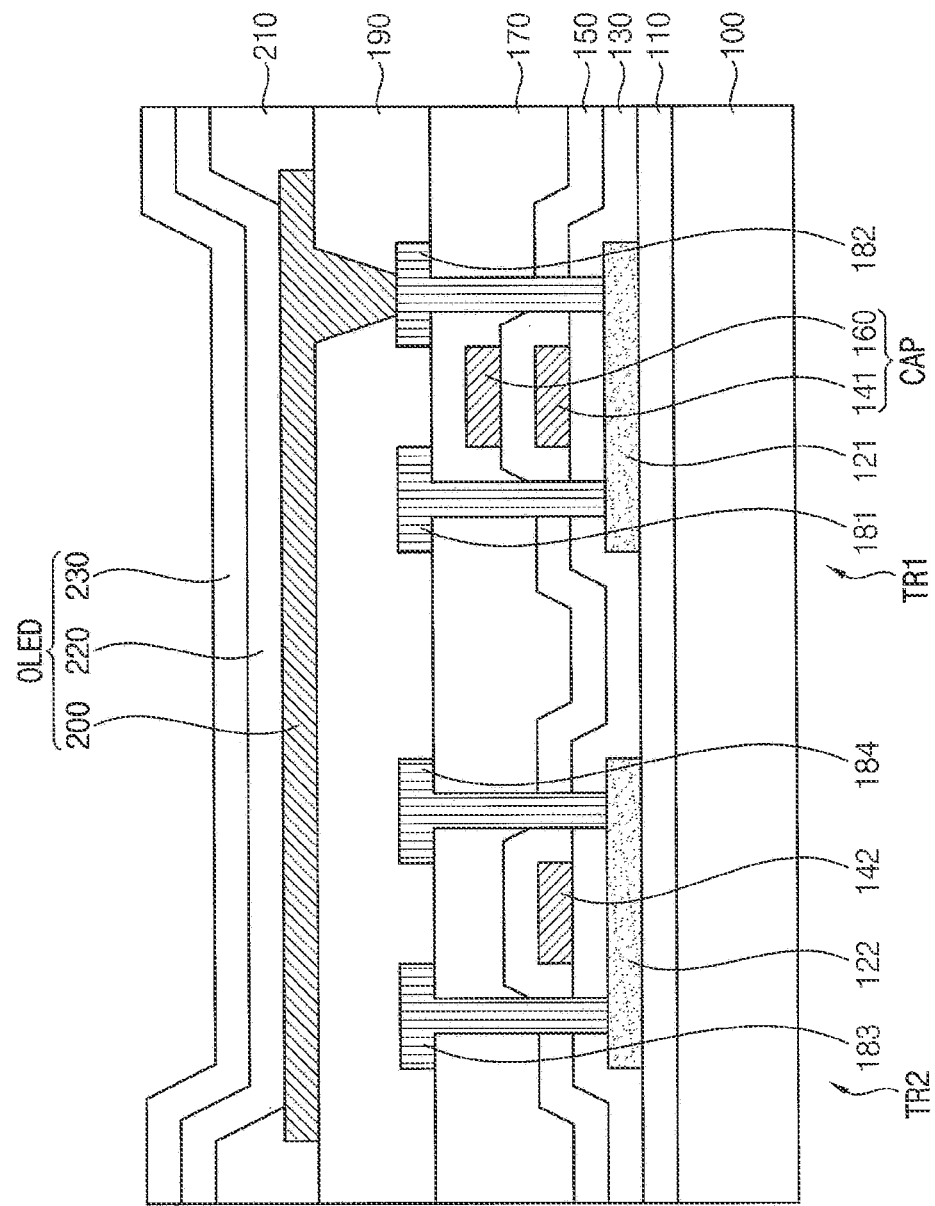
FIG. 2 is a cross-sectional view illustrating a display device according to some example embodiments.

FIG. 2 is a cross-sectional view illustrating a display device according to some example embodiments. For example, FIG. 2 may illustrate an example of a cross-sectional structure of the pixel PX in FIG. 1.

Referring to FIG. 2, a display device according to some example embodiments may include a first transistor TR1, a second transistor TR2, a capacitor CAP, and the organic light emitting diode OLED which are located on a substrate 100. The first transistor TR1, the second transistor TR2, and the capacitor CAP may respectively correspond to the driving transistor TDR, the switching transistor TSW, and the storage capacitor CST in FIG. 1.

The substrate 100 may be a transparent insulating substrate. According to some example embodiments, the substrate 100 may include a plastic such as polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc.

A buffer layer 110 may be arranged on the substrate 100. The buffer layer 110 may prevent or reduce instances of impurities being permeated above the substrate 100, and may improve a flatness over the substrate 100. The buffer layer 110 may include an inorganic insulating material such as silicon oxide ($SiO_x$), silicon nitride ($SiN_x$), silicon oxynitride ($SiO_xN_y$), etc.

A first active pattern 121 and a second active pattern 122 may be located on the buffer layer 110. The first active pattern 121 and the second active pattern 122 may be spaced apart from each other.

According to some example embodiments, the first active pattern 121 and the second active pattern 122 may include amorphous silicon or polycrystalline silicon. Each of the first active pattern 121 and the second active pattern 122 may include a source region and a drain region, in which P-type or N-type impurities are doped, at opposite ends thereof. A channel region, in which impurities are not doped, may be defined between the source region and the drain region.

According to some example embodiments, the first active pattern 121 and the second active pattern 122 may include an oxide semiconductor. In such embodiments, the source region and the drain region may be omitted in each of the first active pattern 121 and the second active pattern 122. The oxide semiconductor may include indium-gallium-zinc oxide (IGZO), zinc-tin oxide (ZTO), indium-tin-zinc oxide (ITZO), etc.

A first gate insulation layer 130 may be located on the first active pattern 121 and the second active pattern 122. The first gate insulation layer 130 may cover the first active pattern 121 and the second active pattern 122, and may be formed on the buffer layer 110. The first gate insulation layer 130 may insulate between the first active pattern 121 and a first gate electrode 141 and between the second active pattern 122 and a second gate electrode 142.

The first gate insulation layer 130 may have a relatively high permittivity. The permittivity of the first gate insulation layer 130 may be greater than a permittivity of the buffer layer 110. According to some example embodiments, the first gate insulation layer 130 may include a material having a relatively high permittivity such as zirconium oxide ($ZrO_2$), hafnium oxide ($HfO_2$), tantalum oxide ($Ta_2O_5$), niobium oxide ($Nb_2O_5$), etc. Accordingly, the permittivity of the first gate insulation layer 130 may be greater than the permittivity of the buffer layer 110 that includes a material having a relatively low permittivity such as silicon oxide ($SiO_x$), silicon nitride ($SiN_x$), silicon oxynitride ($SiO_xN_y$), etc.

According to some example embodiments, the first gate insulation layer 130 may include an inorganic insulation layer and a high permittivity insulation layer having a permittivity greater than that of the inorganic insulation layer. When the first gate insulation layer 130 includes only the high permittivity insulation layer, leakage current via the high permittivity insulation layer may increase. Accordingly, the first gate insulation layer 130 may include the inorganic insulation layer thereby preventing the leakage current via the first gate insulation layer 130 from being increased. Detailed elements of the first gate insulation layer 130 will be described with reference to FIG. 3 below.

The first gate electrode 141 and the second gate electrode 142 may be located on the first gate insulation layer 130. The first gate electrode 141 and the second gate electrode 142 may be spaced apart from each other. The first gate electrode 141 may overlap the first active pattern 121, and the second gate electrode 142 may overlap the second active pattern 122. The first gate electrode 141 and the second gate electrode 142 may include a metal such as aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), etc., an alloy thereof, or a nitride thereof. According to some example embodiments, the first gate electrode 141 and the second gate electrode 142 may include the same material.

A second gate insulation layer 150 may be arranged on the first gate electrode 141 and the second gate electrode 142. The second gate insulation layer 150 may cover the first gate electrode 141 and the second gate electrode 142, and may be formed on the first gate insulation layer 130. The second gate insulation layer 150 may insulate between the first gate electrode 141 and a capacitor electrode 160.

The second gate insulation layer 150 may have a relatively high permittivity. The permittivity of the second gate insulation layer 150 may be greater than the permittivity of the buffer layer 110. According to some example embodiments, the second gate insulation layer 150 may include a material having a relatively high permittivity such as zirconium oxide ($ZrO_2$), hafnium oxide ($HfO_2$), tantalum oxide ($Ta_2O_5$), niobium oxide ($Nb_2O_5$), etc. Accordingly, the permittivity of the second gate insulation layer 150 may be greater than the permittivity of the buffer layer 110 that includes a material having a relatively low permittivity such as silicon oxide ($SiO_x$), silicon nitride ($SiN_x$), silicon oxynitride ($SiO_xN_y$), etc.

According to some example embodiments, the second gate insulation layer 150 may include an inorganic insulation layer and a high permittivity insulation layer having a permittivity greater than that of the inorganic insulation layer. When the second gate insulation layer 150 includes only the high permittivity insulation layer, leakage current via the high permittivity insulation layer may increase. Accordingly, the second gate insulation layer 150 may include the inorganic insulation layer thereby preventing the leakage current via the second gate insulation layer 150 from being increased. Detailed elements of the second gate insulation layer 150 will be described in more detail with reference to FIGS. 5 and 6 below.

The capacitor electrode 160 may be located on the second gate insulation layer 150. The capacitor electrode 160 may overlap the first gate electrode 141. The capacitor electrode 160 may include a metal such as aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), etc., an alloy thereof, or a nitride thereof. The capacitor electrode 160 may form the capacitor CAP together with the first gate electrode 141 and the second gate insulation layer 150. Thus, the first gate electrode 141 may function as an electrode of the capacitor CAP.

An insulation interlayer 170 may be located on the capacitor electrode 160. The insulation interlayer 170 may cover the capacitor electrode 160, and may be formed on the second gate insulation layer 150. The insulation interlayer 170 may insulate a first source electrode 181 and a first drain electrode 182 from the first gate electrode 141 and the capacitor electrode 160, and may insulate a second source electrode 183 and a second drain electrode 184 from the second gate electrode 142. The insulation interlayer 170 may include an inorganic insulating material such as silicon oxide ($SiO_x$), silicon nitride ($SiN_x$), silicon oxynitride ($SiO_xN_y$), etc. or an organic insulating material.

According to some example embodiments, the permittivity of the first gate insulation layer 130 and the permittivity of the second gate insulation layer 150 may be greater than a permittivity of the insulation interlayer 170. The permittivity of the first gate insulation layer 130 and the permittivity of the second gate insulation layer 150 may be greater than the permittivity of the insulation interlayer 170 that includes a material having a relatively low permittivity such as silicon oxide ($SiO_x$), silicon nitride ($SiN_x$), silicon oxynitride ($SiO_xN_y$), etc.

The first source electrode 181, the first drain electrode 182, the second source electrode 183, and the second drain electrode 184 may be located on the insulation interlayer 170. The first source electrode 181, the first drain electrode 182, the second source electrode 183, and the second drain electrode 184 may be spaced apart from each other. The first source electrode 181 and the first drain electrode 182 may pass through the first gate insulation layer 130, the second gate insulation layer 150, and the insulation interlayer 170, and may be connected to the first active pattern 121. The second source electrode 183 and the second drain electrode 184 may pass through the first gate insulation layer 130, the second gate insulation layer 150, and the insulation interlayer 170, and may be connected to the second active pattern 122.

The first source electrode 181, the first drain electrode 182, the second source electrode 183, and the second drain electrode 184 may include a metal such as aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), etc., an alloy thereof, or a nitride thereof. According to some example embodiments, the first source electrode 181, the first drain electrode 182, the second source electrode 183, and the second drain electrode 184 may include the same material. The first source electrode 181 and the first drain electrode 182 may form the first transistor TR1 together with the first active pattern 121, the first gate insulation layer 130, and the first gate electrode 141. The second source electrode 183 and the second drain electrode 184 may form the second transistor TR2 together with the second active pattern 122, the first gate insulation layer 130, and the second gate electrode 142.

A planarization layer 190 may be located on the first source electrode 181, the first drain electrode 182, the second source electrode 183, and the second drain electrode 184. The planarization layer 190 may cover the first source electrode 181, the first drain electrode 182, the second source electrode 183, and the second drain electrode 184, and may be formed on the insulation interlayer 170. The planarization layer 190 may protect the first transistor TR1 and the second transistor TR2, and may provide a planarized surface to a first electrode 200. The planarization layer 190 may include an organic insulating material such as acryl-based resin, polyimide-based resin, siloxane-based resin, benzocyclobutene (BCB), etc.

The organic light emitting diode OLED electrically connected to the first transistor TR1 may be provided on the planarization layer 190. The organic light emitting diode OLED may include the first electrode 200, an intermediate layer 220, and a second electrode 230.

The first electrode 200 may be located on the planarization layer 190. The first electrode 200 may pass through the planarization layer 190, and may be connected to the first drain electrode 182. The first electrode 200 may include a transparent conductive material such as indium tin oxide (ITO), zinc tin oxide (ZTO), indium zinc oxide (IZO), zinc oxide, tin oxide, etc. and/or a metal such as chromium, aluminum, tantalum, molybdenum, titanium, tungsten, copper, silver, neodymium, etc. The first electrode 200 may be provided as an anode of the organic light emitting diode OLED.

A pixel defining layer 210 may be located on the first electrode 200. The pixel defining layer 210 may cover an edge of the first electrode 200, and may be formed on the planarization layer 190. The pixel defining layer 210 may have an opening that exposes a center portion of the first electrode 200 to define a pixel, and may increase a distance between the edge of the first electrode 200 and the second electrode 230 above the first electrode 200 to prevent the occurrence of arc, etc., at the edge of the first electrode 200. The pixel defining layer 210 may include an organic insulating material acryl-based resin, polyimide-based resin, siloxane-based resin, benzocyclobutene (BCB), etc. or an inorganic insulating material.

The intermediate layer 220 may be located on the first electrode 200 and the pixel defining layer 210. The intermediate layer 220 may include an emission layer including a low molecular organic material or a high molecular organic material. According to some example embodiments, the intermediate layer 220 may further include a hole injection layer ("HIL"), a hole transport layer ("HTL"), an electron transport layer ("ETL"), and/or an electron injection layer ("EIL") located on or under the emission layer.

The second electrode 230 may be located on the intermediate layer 220. The second electrode 230 may include a metal, such as lithium (Li), calcium (Ca), fluoride lithium-calcium (LiF—Ca), fluoride lithium-aluminum (LiF—Al), Al, Mg, Ag, Cr, W, Mo, Ti, etc. and an alloy thereof. On the other hand, the second electrode 230 may include a transparent conductive material such as ITO, IZO, ZTO, zinc oxide, tin oxide, etc. The second electrode 230 may be provided as a cathode of the organic light emitting diode OLED.

Figure 3:
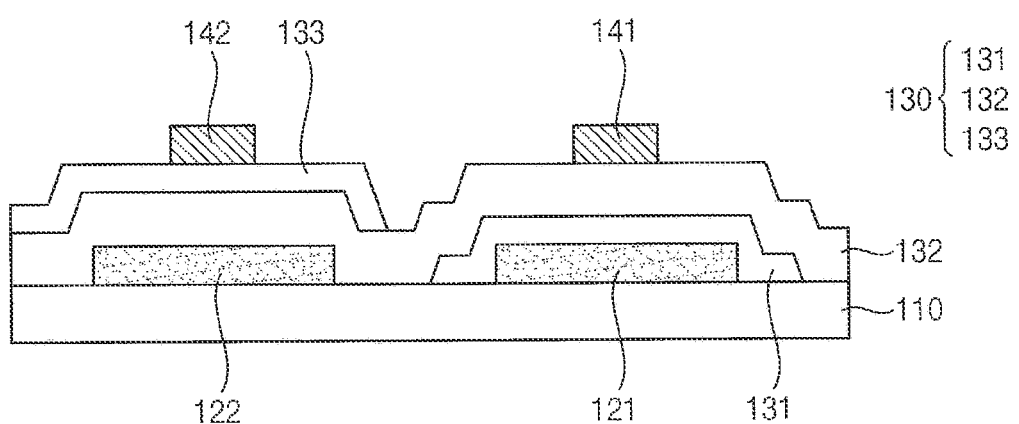
FIG. 3 is a cross-sectional view illustrating a first gate insulation layer according to some example embodiments.

FIG. 3 is a cross-sectional view illustrating a first gate insulation layer according to some example embodiments. FIG. 3 may illustrate a cross-sectional structure of the first gate insulation layer 130 in FIG. 2.

Referring to FIG. 3, the first gate insulation layer 130 may include a first high permittivity insulation layer 131, a first inorganic insulation layer 132, and a second high permittivity insulation layer 133.

The first high permittivity insulation layer 131 may be located on the first active pattern 121. The first high permittivity insulation layer 131 may cover the first active pattern 121, and may be formed on the buffer layer 110. The first high permittivity insulation layer 131 may include a material having a relatively high permittivity such as zirconium oxide ($ZrO_2$), hafnium oxide ($HfO_2$), tantalum oxide ($Ta_2O_5$), niobium oxide ($Nb_2O_5$), etc.

According to some example embodiments, the first high permittivity insulation layer 131 may be patterned to overlap the first active pattern 121. In other words, the first high permittivity insulation layer 131 may not overlap the second active pattern 122. For example, the material having a relatively high permittivity may be deposited on the buffer layer 110, on which the first active pattern 121 and the second active pattern 122 are formed, by an atomic layer deposition (ALD), a chemical vapor deposition (CVD), etc., and may be patterned to form the first high permittivity insulation layer 131.

The first inorganic insulation layer 132 may be located on the first high permittivity insulation layer 131. The first inorganic insulation layer 132 may cover the second active pattern 122 and the first high permittivity insulation layer 131, and may be formed on the buffer layer 110. The first high permittivity insulation layer 131 may overlap the first active pattern 121 and the second active pattern 122. The first inorganic insulation layer 132 may include a material having a relatively low permittivity such as silicon oxide ($SiO_x$), silicon nitride ($SiN_x$), silicon oxynitride ($SiO_xN_y$), etc. Accordingly, a permittivity of the first inorganic insulation layer 132 may be less than a permittivity of the first high permittivity insulation layer 131.

The first inorganic insulation layer 132 may be formed with a thickness greater than that of the first high permittivity insulation layer 131. In other words, the thickness of the first high permittivity insulation layer 131 may be less than the thickness of the first inorganic insulation layer 132. For example, the thickness of the first high permittivity insulation layer 131 may be about 50 Å, and the thickness of the first inorganic insulation layer 132 may be from about 1200 Å to about 1300 Å.

The second high permittivity insulation layer 133 may be located on the first inorganic insulation layer 132. The second high permittivity insulation layer 133 may include a material having a relatively high permittivity such as zirconium oxide ($ZrO_2$), hafnium oxide ($HfO_2$), tantalum oxide ($Ta_2O_5$), niobium oxide ($Nb_2O_5$), etc. Therefore, the permittivity of the second high permittivity insulation layer 133 may be greater than the permittivity of the first inorganic insulation layer 132.

According to some example embodiments, the second high permittivity insulation layer 133 may be patterned to overlap the second active pattern 122. In other words, the second high permittivity insulation layer 133 may not overlap the first active pattern 121. For example, the material having a relatively high permittivity may be deposited on the first inorganic insulation layer 132 by an atomic layer deposition (ALD), a chemical vapor deposition (CVD), etc., and may be patterned to form the second high permittivity insulation layer 133.

The second high permittivity insulation layer 133 may be formed with a thickness less than that of the first inorganic insulation layer 132. In other words, the thickness of the second high permittivity insulation layer 133 may be less than the thickness of the first inorganic insulation layer 132. For example, the thickness of the second high permittivity insulation layer 133 may be about 50 Å.

The first high permittivity insulation layer 131 may be patterned to overlap the first active pattern 121, so that the first high permittivity insulation layer 131 and the first inorganic insulation layer 132 may be sequentially stacked between the first active pattern 121 and the first gate electrode 141. The first high permittivity insulation layer 131 may be located at an interface between the first gate insulation layer 130 and the first active pattern 121, so that a driving range of the first transistor TR1 may increase.

The second high permittivity insulation layer 133 may be patterned to overlap the second active pattern 122, so that the first inorganic insulation layer 132 and the second high permittivity insulation layer 133 may be sequentially stacked between the second active pattern 122 and the second gate electrode 142. A capacitance between the second active pattern 122 and the second gate electrode 142 may increase, so that a driving speed of the second transistor TR2 may increase.

Figure 4:
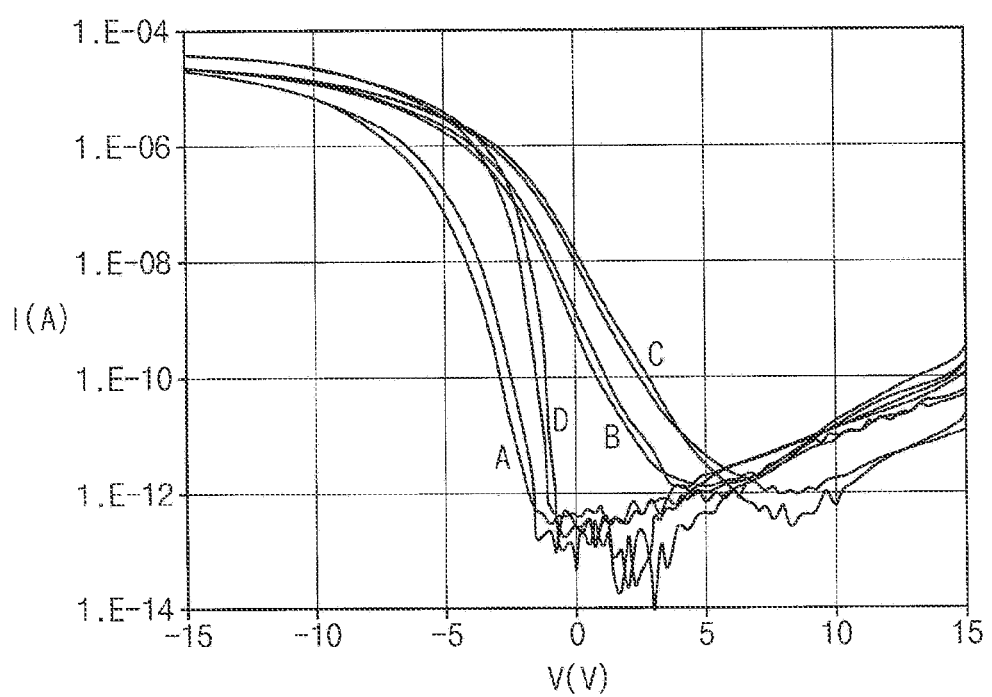
FIG. 4 is a graph illustrating characteristics of the transistors in FIG. 2.

FIG. 4 is a graph illustrating characteristics of the transistors in FIG. 2. Curve A illustrates voltage (V)-current (I) characteristic of a transistor in which a first gate insulation layer includes a silicon oxide layer having a thickness of about 1300 Å according to a comparative example, and curve B illustrates voltage (V)-current (I) characteristic of the first transistor TR1 in which the first gate insulation layer 130 includes a zirconium oxide layer having a thickness of about 50 Å and a silicon oxide layer having a thickness of about 1200 Å according to some example embodiments of the present invention. Curve C illustrates voltage (V)-current (I) characteristic of the first transistor TR1 in which the first gate insulation layer 130 includes a zirconium oxide layer having a thickness of about 50 Å and a silicon oxide layer having a thickness of about 1300 Å according to some example embodiments of the present invention, and curve D illustrates voltage (V)-current (I) characteristic of the second transistor TR2 in which the first gate insulation layer 130 includes a silicon oxide layer having a thickness of about 1200 Å and a zirconium oxide layer having a thickness of about 50 Å according to some example embodiments of the present invention.

Referring to FIG. 4, a slope of a voltage (V)-current (I) curve of the first transistor TR1 according to some example embodiments may be less than a slope of a voltage (V)-current (I) curve of the transistor according to the comparative example. Therefore, a driving range of the first transistor TR1 according to some example embodiments may be greater than a driving range of the transistor according to the comparative example. In general, it may be advantageous that the driving transistor has a large driving range to express various grayscales. The first high permittivity insulation layer 131 and the first inorganic insulation layer 132 may be formed between the first active pattern 121 and the first gate electrode 141 of the first transistor TR1 according to the present embodiment which functions as the driving transistor, so that the driving range of the first transistor TR1 may increase, and the display device may display a more detailed color.

A slope of a voltage (V)-current (I) curve of the second transistor TR2 according to some example embodiments may be greater than the slope of the voltage (V)-current (I) curve of the transistor according to the comparative example. In general, it may be advantageous that the voltage-current curve of the switching transistor has a large slope for a fast driving speed. The first inorganic insulation layer 132 and the second high permittivity insulation layer 133 may be formed between the second active pattern 122 and the second gate electrode 142 of the second transistor TR2 according to the present embodiment which functions as the switching transistor, so that the driving speed of the second transistor TR2 may increase.

Figure 5:
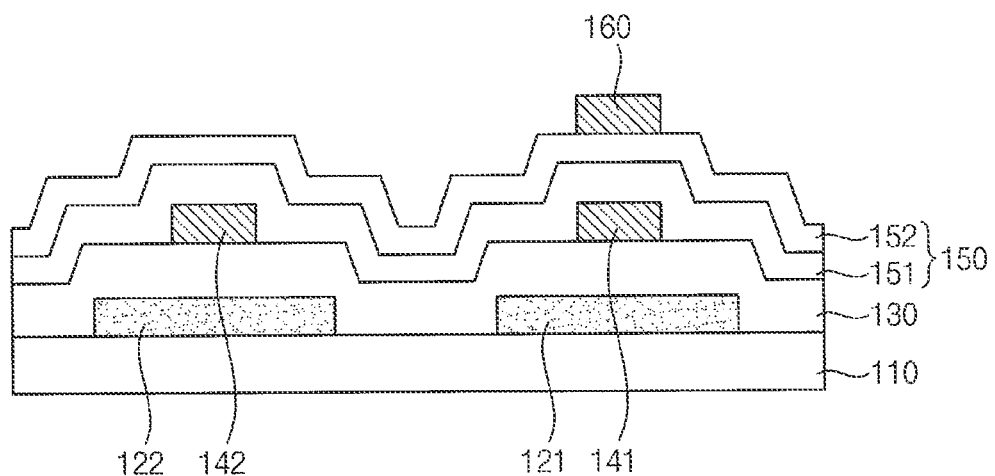
FIG. 5 is a cross-sectional view illustrating a second gate insulation layer according to some example embodiments.

FIG. 5 is a cross-sectional view illustrating a second gate insulation layer according to some example embodiments. FIG. 5 may illustrate an example of a cross-sectional structure of the second gate insulation layer 150 in FIG. 2.

Referring to FIG. 5, the second gate insulation layer 150 may include a second inorganic insulation layer 151 and a third high permittivity insulation layer 152.

The second inorganic insulation layer 151 may be located on the first gate electrode 141 and the second gate electrode 142. The second inorganic insulation layer 151 may cover the first gate electrode 141 and the second gate electrode 142, and may be formed on the first gate insulation layer 130. The second inorganic insulation layer 151 may overlap the first gate electrode 141 and the second gate electrode 142. The second inorganic insulation layer 151 may include a material having a relatively low permittivity such as silicon oxide ($SiO_x$), silicon nitride ($SiN_x$), silicon oxynitride ($SiO_xN_y$), etc.

The third high permittivity insulation layer 152 may be located on the second inorganic insulation layer 151. The third high permittivity insulation layer 152 may include a material having a relatively high permittivity such as zirconium oxide ($ZrO_2$), hafnium oxide ($HfO_2$), tantalum oxide ($Ta_2O_5$), niobium oxide ($Nb_2O_5$), etc. Therefore, the permittivity of the third high permittivity insulation layer 152 may be greater than the permittivity of the second inorganic insulation layer 151.

The third high permittivity insulation layer 152 may be formed with a thickness less than that of the second inorganic insulation layer 151. In other words, the thickness of the third high permittivity insulation layer 152 may be less than the thickness of the second inorganic insulation layer 151. For example, the thickness of the second inorganic insulation layer 151 may be from about 1200 Å to about 1300 Å, and the thickness of the third high permittivity insulation layer 152 may be about 50 Å.

According to some example embodiments, the third high permittivity insulation layer 152 may be formed entirely on the first gate electrode 141 and the second gate electrode 142. In other words, the third high permittivity insulation layer 152 may overlap the first gate electrode 141 and the second gate electrode 142.

Figure 6:
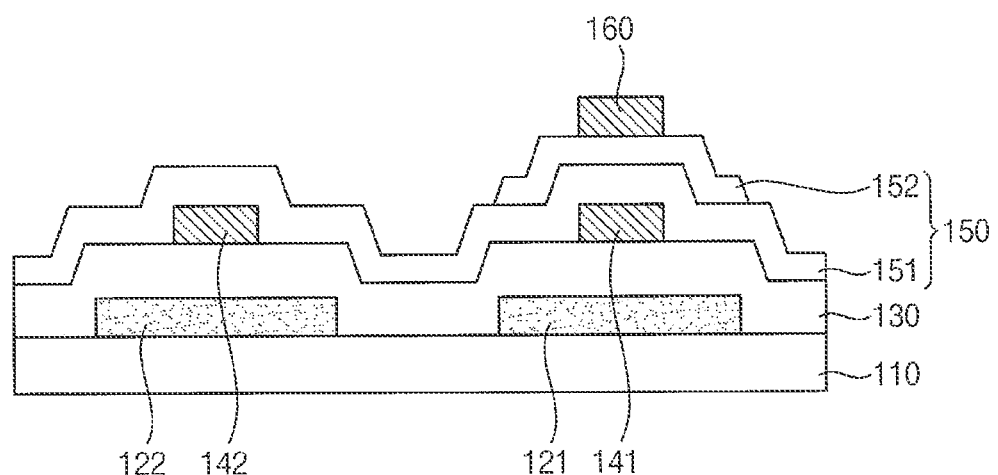
FIG. 6 is a cross-sectional view illustrating a second gate insulation layer according to some example embodiments.

FIG. 6 is a cross-sectional view illustrating a second gate insulation layer according to some example embodiments. FIG. 6 may illustrate another example of a cross-sectional structure of the second gate insulation layer 150 in FIG. 2.

Referring to FIG. 6, according to some example embodiments, the third high permittivity insulation layer 152 may be patterned to overlap the first gate electrode 141. In other words, the third high permittivity insulation layer 152 may not overlap the second gate electrode 142. For example, the material having a relatively high permittivity may be deposited on the second inorganic insulation layer 151 by an atomic layer deposition (ALD), a chemical vapor deposition (CVD), etc., and may be patterned to form the third high permittivity insulation layer 152.

When the third high permittivity insulation layer 152 is formed on a portion of the second inorganic insulation layer 151 outside between the first gate electrode 141 and the capacitor electrode 160, leakage current via the third high permittivity insulation layer 152 may increase. Accordingly, the third high permittivity insulation layer 152 may be patterned to be formed between the first gate electrode 141 and the capacitor electrode 160, so that leakage current via the second gate insulation layer 150 may not be increased.

According to some example embodiments, the second gate insulation layer 150 having a relatively high permittivity may be located between the electrodes 141 and 160 of the capacitor CAP, so that a capacitance of the capacitor CAP may increase. Therefore, a response speed of the pixel PX may increase, and afterimage and flicker of the display device may be reduced.

Figure 7A:
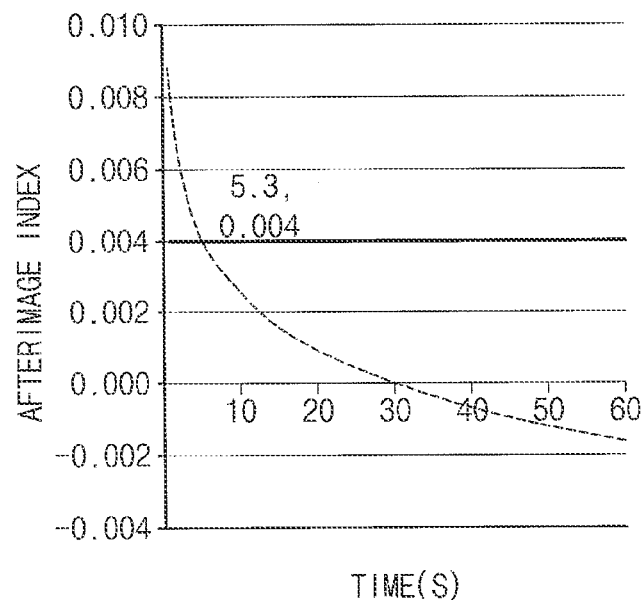
FIGS. 7A and 7B are graphs respectively illustrating afterimage of a display device according to a comparative example and afterimage of a display device according to some example embodiments example of the present invention.
Figure 7B:
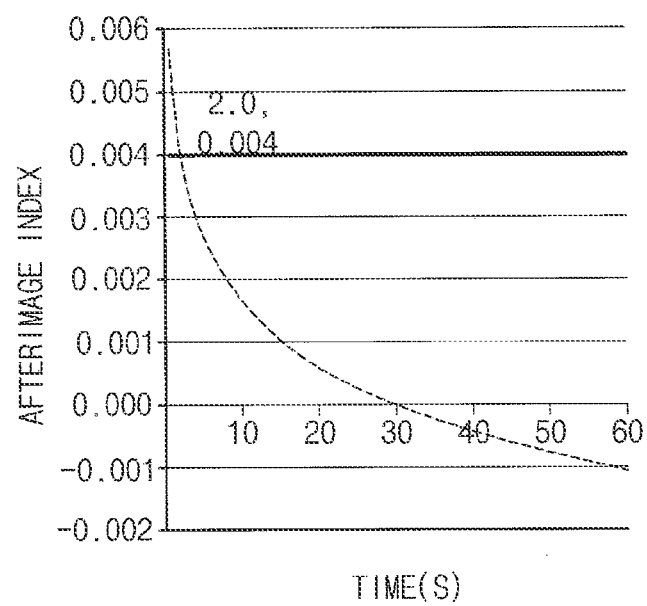

FIGS. 7A and 7B are graphs respectively illustrating afterimage of a display device according to a comparative example and afterimage of a display device according to some example embodiments of the present invention.

In general, when data of a specific grayscale is applied to a pixel that displayed black or white, afterimage may be evaluated through an experiment in which the time required for the pixel to emit light of an luminance corresponding to the data of the specific grayscales is measured. FIG. 7A illustrates a measurement result of the afterimage of the display device according to the comparative example, and FIG. 7B illustrates a measurement result of the afterimage of the display device according to some example embodiments.

Referring to FIGS. 7A and 7B, a time for which an afterimage index (for example, a difference in luminance between black or white and the luminance corresponding to the data of the specific grayscale) reaches a predetermined value (e.g., 0.004) may be about 5.3 seconds in the display device according to the comparative example, and may be about 2.0 seconds in the display device according to some example embodiments. The second gate insulation layer 150 having a relatively high permittivity may be formed between the electrodes 141 and 160 of the capacitor CAP according to some example embodiments, so that a capacitance of the capacitor CAP may increase, and the afterimage of the display device may be reduced.

TABLE 1

|  | Comparative example | | | | Embodiment example | | | |
| --- | --- | --- | --- | --- | --- | --- | --- | --- |
|  | 60 Hz | 30 Hz | 15 Hz | 10 Hz | 60 Hz | 30 Hz | 15 Hz | 10 Hz |
| 32 | 17.7 | 29.4 | 61 | 78 | 21 | 9.65 | 26.95 | 32.25 |
| 64 | 9.8 | 14.9 | 32.7 | 40 | 6.45 | 8.65 | 25 | 28.3 |
| 128 | 13.2 | 20 | 38 | 41.7 | 6.35 | 12.6 | 30.4 | 34.2 |
| 224 | 14.9 | 23.8 | 43.6 | 48 | 7.95 | 14.2 | 33.9 | 38.75 |

Table 1 illustrates flicker of the display device according to a comparative example and flicker of the display device according to some example embodiments of the present invention. For example, Table 1 illustrates flicker indexes of the display device according to the comparative example and the display device according to some example embodiments for a plurality of grayscales and a plurality of frequencies.

Referring to Table 1, a flicker index of the display device according to some example embodiments may be less than a flicker index of the display device according to the comparative example in the same grayscale and the same frequency. As the flicker index decreases, the flicker may not be recognized. The second gate insulation layer 150 having a relatively high permittivity may be formed between the electrodes 141 and 160 of the capacitor CAP according to some example embodiments, so that a capacitance of the capacitor CAP may increase, and the flicker of the display device may be reduced.

Figure 8:
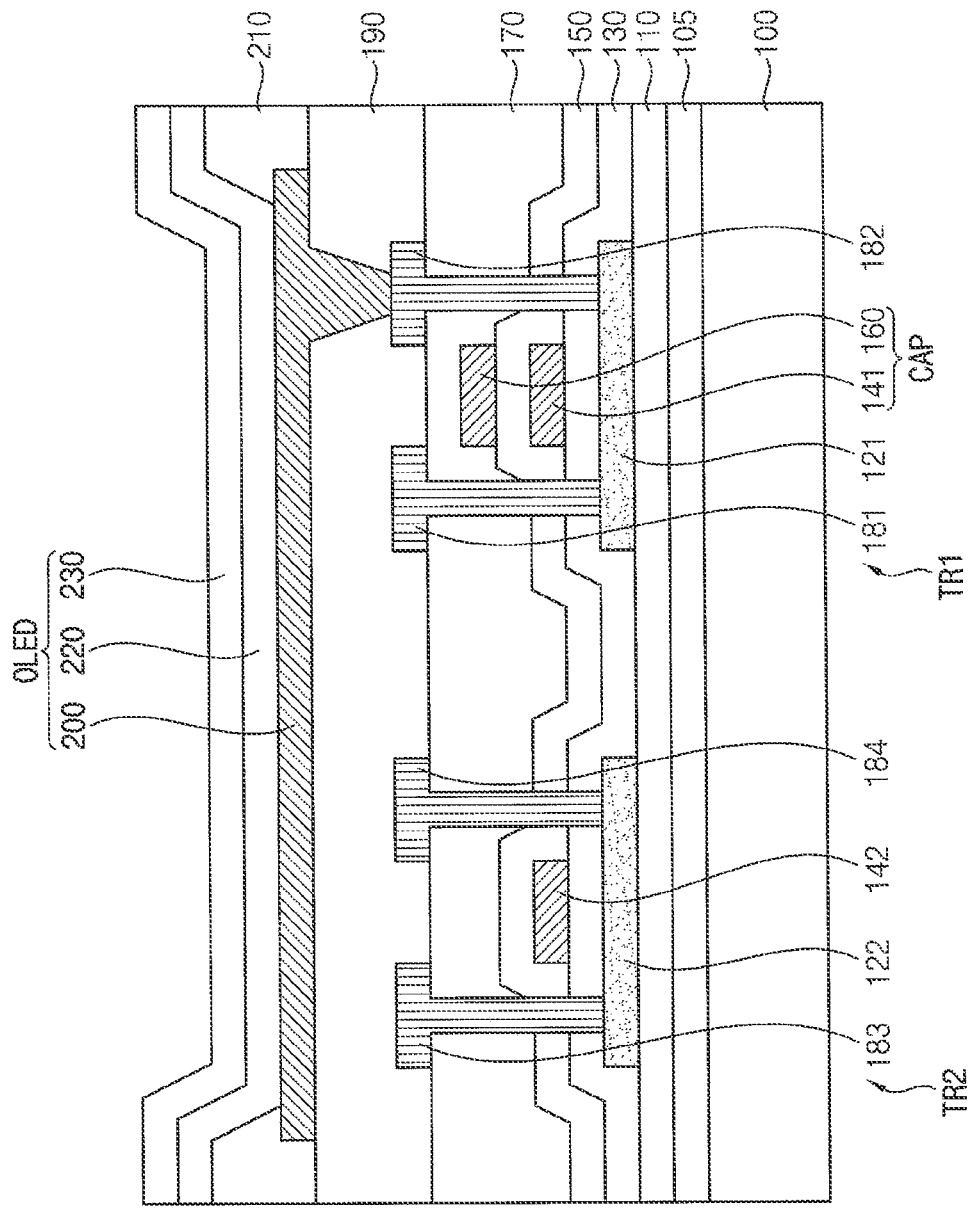
FIG. 8 is a cross-sectional view illustrating a display device according to some example embodiments.

FIG. 8 is a cross-sectional view illustrating a display device according to some example embodiments. For example, FIG. 8 may illustrate another example of a cross-sectional structure of the pixel PX in FIG. 1.

The display device described with reference to FIG. 8 may be substantially the same as or similar to the display device described with reference to FIG. 2 except for an addition of a fourth high permittivity insulation layer. Accordingly, detailed descriptions on elements of the display device described with reference to FIG. 8, which are substantially the same as or similar to those of the display device described with reference to FIG. 2, may not be repeated.

Referring to FIG. 8, a fourth high permittivity insulation layer 105 may be additionally located between the substrate 100 and the buffer layer 110. The fourth high permittivity insulation layer 105 may be located entirely on the substrate 100, and may overlap the first active pattern 121 and the second active pattern 122.

The fourth high permittivity insulation layer 105 may include a material having a relatively high permittivity such as zirconium oxide ($ZrO_2$), hafnium oxide ($HfO_2$), tantalum oxide ($Ta_2O_5$), niobium oxide ($Nb_2O_5$), etc. Accordingly, a permittivity of the fourth high permittivity insulation layer 105 may be greater than a permittivity of the buffer layer 110 that includes a material having a relatively low permittivity such as silicon oxide ($SiO_x$), silicon nitride ($SiN_x$), silicon oxynitride ($SiO_xN_y$), etc.

In a process of forming a display device, a support substrate for supporting the substrate 100 may be formed under the substrate 100, and electric charges may be permeated into the substrate 100 from the support substrate. Further, when the substrate 100 includes an organic material, electric charges may be stored in the substrate 100. In this case, an electric field may be formed between the substrate 100 having the electric charges and the active patterns 121 and 122, and image sticking may occur on the display device. However, in the display device according to some example embodiments, the fourth high permittivity insulation layer 105 having a relatively high permittivity may be formed between the substrate 100 and the buffer layer 110, and the fourth high permittivity insulation layer 105 may decrease the electric field between the substrate 100 and the active patterns 121 and 122. Therefore, image sticking on the display device according to the present embodiment may be reduced.

The fourth high permittivity insulation layer 105 may be deposited on the substrate 100 by an atomic layer deposition (ALD), etc., therefore, the fourth high permittivity insulation layer 105 may have a relatively high density. For example, a density of the fourth high permittivity insulation layer 105 may be greater than a density of the buffer layer 110. The fourth high permittivity insulation layer 105 may have a relatively high density, so that impurities permeated through the substrate 100 may be blocked by the fourth high permittivity insulation layer 105. For example, impurities that are charged and permeated through the substrate 100 may be blocked by the fourth high permittivity insulation layer 105, so that the electric field between the substrate 100 and the active pattern 121 and 122 may be reduced, and image sticking on the display device may be reduced.

Figure 9:
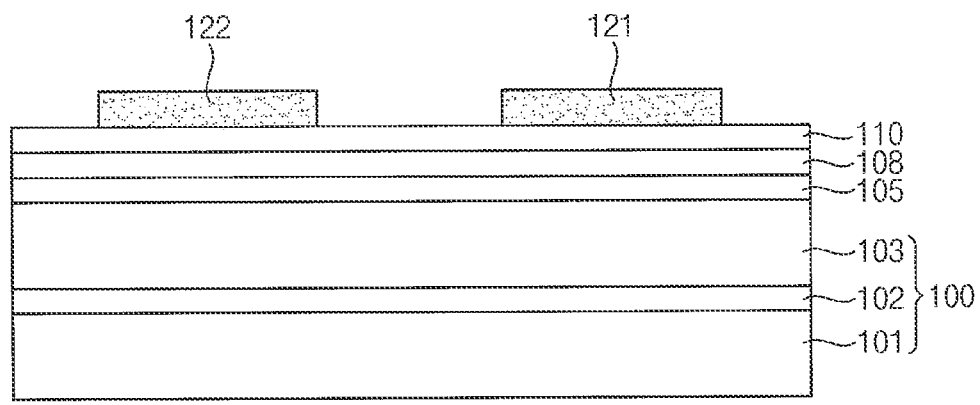
FIG. 9 is a cross-sectional view illustrating a substrate according to some example embodiments.

FIG. 9 is a cross-sectional view illustrating a substrate according to some example embodiments. FIG. 9 may illustrate an example of a cross-sectional structure of the substrate 100 in FIG. 8.

Referring to FIG. 9, according to some example embodiments, the substrate 100 may have a multilayer structure including a first organic layer 101, a second organic layer 103 located on the first organic layer 101, and an inorganic layer 102 located between the first organic layer 101 and the second organic layer 103.

The first organic layer 101 and the second organic layer 102 may include a plastic such as polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc. The first organic layer 101 and the second organic layer 102 may be flexible.

The inorganic layer 102 may include an inorganic insulating material such as silicon oxide ($SiO_x$), silicon nitride ($SiN_x$), silicon oxynitride ($SiO_xN_y$), etc., and/or amorphous silicon. The inorganic layer 102 may prevent impurities from being permeated through the substrate 100.

According to some example embodiments, a barrier layer 108 may be additionally located between the fourth high permittivity insulation layer 105 and the buffer layer 110. The barrier layer 108 may include an inorganic insulating material such as silicon oxide ($SiO_x$), silicon nitride ($SiN_x$), silicon oxynitride ($SiO_xN_y$), etc. The barrier layer 108 may prevent impurities from being permeated through the substrate 100.

Figure 10:
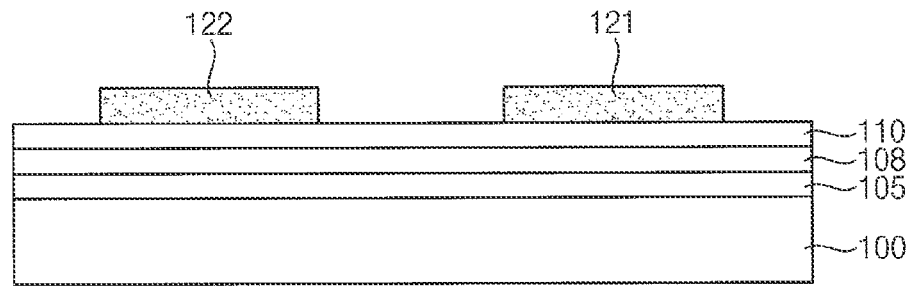
FIG. 10 is a cross-sectional view illustrating a substrate according to some example embodiments.

FIG. 10 is a cross-sectional view illustrating a substrate according to some example embodiments. FIG. 10 may illustrate another example of a cross-sectional structure of the substrate 100 in FIG. 8.

Referring to FIG. 10, according to some example embodiments, the substrate 100 may have a single-layer structure including an organic layer. The organic layer may include a plastic such as polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc. The organic layer may be flexible.

The fourth high permittivity insulation layer 105 having a relatively high density may be formed between the substrate 100 and the buffer layer 110, so that impurities permeated through the substrate 100 may be blocked by the fourth high permittivity insulation layer 105. Because an inorganic layer that can block the permeation of the impurities into the substrate 100 is omitted, the substrate 100 may have a single-layer structure including the organic layer, therefore, a thickness of the substrate 100 may decrease.

Figure 11:
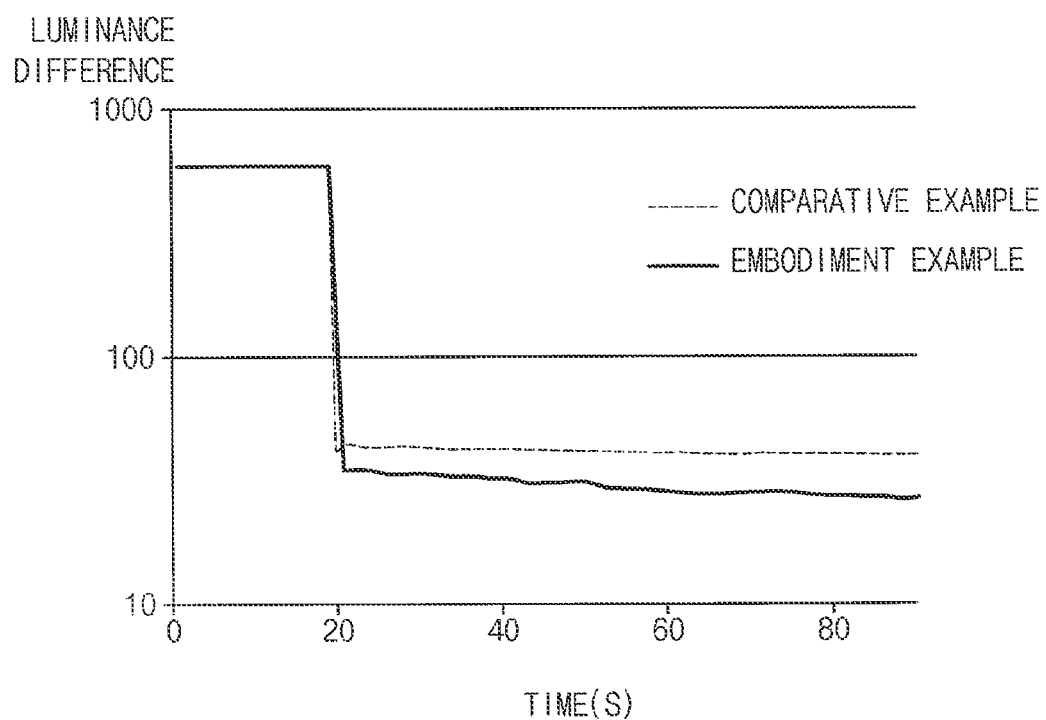
FIG. 11 is a graph illustrating image sticking of a display device according to a comparative example and sticking of a display device according to some example embodiments of the present invention.

FIG. 11 is a graph illustrating image sticking of a display device according to a comparative example and image sticking of a display device according to some example embodiments of the present invention.

In general, when a black or white image is displayed after displaying a chess board pattern on a display device for a predetermined time, image sticking may be evaluated through an experiment of measuring a luminance difference between black and white over time. FIG. 11 illustrates a measurement result of the luminance difference between black and white over time when the white image is displayed after displaying the chess board pattern on the display device according to the comparative example and the display device according to some example embodiments for 20 seconds.

Referring to FIG. 11, after displaying the white image, a luminance difference of the display device according to some example embodiments may be less than a luminance difference of the display device according to comparative example. As a luminance difference between black and white decreases, the image sticking may decrease. The high permittivity insulation layer 105 having a relatively high density may be formed between the substrate 100 and the buffer layer 110 of the display device according to some example embodiments, so that an electric field between the substrate 100 and the active patterns 121 and 122 may be reduced, and impurities permeated through the substrate 100 may be blocked. Therefore, image sticking of the display device may be reduced.

Figure 12:
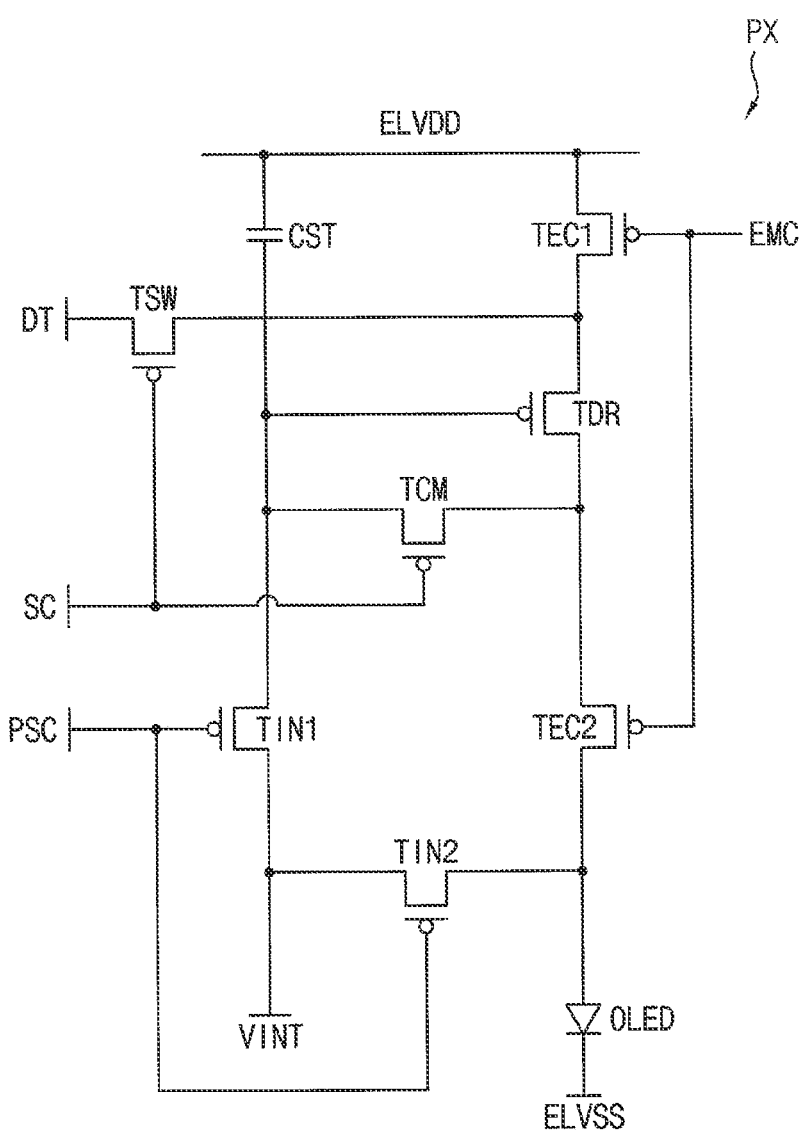
FIG. 12 is a circuit diagram illustrating a pixel included in a display device according to some example embodiments.

FIG. 12 is a circuit diagram illustrating a pixel included in a display device according to some example embodiments.

Referring to FIG. 12, each of pixels PX included in a display device according to some example embodiments may include a driving transistor TDR, a switching transistor TSW, a compensation transistor TCM, a first initialization transistor TIN1, a second initialization transistor TIN2, a first emission control transistor TEC1, a second emission control transistor TEC2, a storage capacitor CST, and an organic light emitting diode OLED.

A gate electrode of the driving transistor TDR may be electrically connected to a drain electrode of the first initialization transistor TIN1, a drain electrode of the compensation transistor TCM, and a first electrode of the storage capacitor CST. A source electrode of the driving transistor TDR may receive a driving voltage ELVDD via the first emission control transistor TEC1, and a drain electrode of the driving transistor TDR may be electrically connected to an anode of the organic light emitting diode OLED via the second emission control transistor TEC2. The driving transistor TDR may receive a data signal DT from the switching transistor TSW, and may supply a driving current to the organic light emitting diode OLED.

A gate electrode of the switching transistor TSW may receive a scan signal SC. A source electrode of the switching transistor TSW may receive the data signal DT, and the drain electrode of the switching transistor TSW may be electrically connected to the source electrode of the driving transistor TDR. The switching transistor TSW may be turned-on in response to the scan signal SC, and may transmit the data signal DT to the source electrode of the driving transistor TDR.

A gate electrode of the compensation transistor TCM may receive the scan signal SC. A source electrode of the compensation transistor TCM may be electrically connected to the drain electrode of the driving transistor TDR, and the drain electrode of the compensation transistor TCM may be electrically connected to the gate electrode of the driving transistor TDR. The compensation transistor TCM may be turned-on in response to the scan signal SC, and may diode-connect the gate electrode and the drain electrode of the driving transistor TDR.

A gate electrode of the first initialization transistor TIN1 may receive a previous scan signal PSC. A source electrode of the first initialization transistor TIN1 may receive an initialization voltage VINT, and the drain electrode of the first initialization transistor TIN1 may be electrically connected to the gate electrode of the driving transistor TDR. The first initialization transistor TIN1 may be turned-on in response to the previous scan signal PSC, and may transmit the initialization voltage VINT to the gate electrode of the driving transistor TDR.

A gate electrode of the second initialization transistor TIN2 may receive the previous scan signal PSC. A source electrode of the second initialization transistor TIN2 may receive the initialization voltage VINT, and a drain electrode of the first initialization transistor TIN1 may be electrically connected to the anode of the organic light emitting diode OLED. The second initialization transistor TIN2 may be turned-on in response to the previous scan signal PSC, and may transmit the initialization voltage VINT to the anode of the organic light emitting diode OLED.

A gate electrode of the first emission control transistor TEC1 may receive an emission control signal EMC. A source electrode of the first emission control transistor TEC1 may receive the driving voltage ELVDD, and the drain electrode of the first emission control transistor TEC1 may be electrically connected to the source electrode of the driving transistor TDR.

A gate electrode of the second emission control transistor TEC2 may receive the emission control signal EMC. A source electrode of the second emission control transistor TEC2 may be electrically connected to the drain electrode of the driving transistor TDR, and the drain electrode of the second emission control transistor TEC2 may be electrically connected to the anode of the organic light emitting diode OLED. The first emission control transistor TEC1 and the second emission control transistor TEC2 may be turned-on in response to the emission control signal EMC, and the driving voltage ELVDD may be transmitted to the organic light emitting diode OLED such that the driving current may pass through the organic light emitting diode OLED.

The first electrode of the storage capacitor CST may be electrically connected to the gate electrode of the driving transistor TDR and a second electrode of the storage capacitor CST may receive the driving voltage ELVDD. The storage capacitor CST may maintain a voltage between the gate electrode and the source electrode of the driving transistor TDR when the switching transistor TSW is turned-off.

The anode of the organic light emitting diode OLED may be electrically connected to the drain electrode of the driving transistor TDR via the second emission control transistor TEC2, and a cathode of the organic light emitting diode OLED may receive a common voltage ELVSS. The organic light emitting diode OLED may emit light based on the driving current supplied from the driving transistor TDR.

The first transistor TR1, the second transistor TR2, and the capacitor CAP of the display device described with reference to FIG. 2 or 8 may correspond to the driving transistor TDR, the switching transistor TSW, and the storage capacitor CST in FIG. 12, respectively. However, the embodiments according to the present disclosure are not limited thereto, and each of the first transistor TR1 the second transistor TR2 may correspond to the compensation transistor TCM, the first initialization transistor TIN1, the second initialization transistor TIN2, the first emission control transistor TEC1, or the second emission control transistor TEC2 in FIG. 12.

The display device according to the embodiments may be applied to a display device included in a computer, a notebook, a mobile phone, a smartphone, a smart pad, a PMP, a PDA, an MP3 player, or the like.

Although the display devices according to some example embodiments have been described with reference to the drawings, the illustrated embodiments are examples, and may be modified and changed by a person having ordinary knowledge in the relevant technical field without departing from the technical spirit described in the following claims and their equivalents.

What is claimed is:

1. A display device, comprising:
a substrate;
a first active pattern on the substrate;
a first high permittivity insulation layer on the first active pattern;
a first inorganic insulation layer on the first high permittivity insulation layer;
a second gate insulation layer on the first inorganic insulation layer; and
a capacitor electrode on the second gate insulation layer, the capacitor electrode overlapping the first active pattern,
wherein a permittivity of the first high permittivity insulation layer is greater than a permittivity of the first inorganic insulation layer, and
wherein the first high permittivity insulation layer is patterned to overlap the first active pattern.

2. The display device of claim 1, wherein a thickness of the first high permittivity insulation layer is less than a thickness of the first inorganic insulation layer.

3. The display device of claim 1, further comprising:
a second active pattern between the substrate and the first inorganic insulation layer, the second active pattern being spaced from the first active pattern; and
a second gate electrode between the first inorganic insulation layer and the second gate insulation layer, the second gate electrode overlapping the second active pattern.

4. The display device of claim 3, further comprising:
a second high permittivity insulation layer between the first inorganic insulation layer and the second gate electrode,
wherein a permittivity of the second high permittivity insulation layer is greater than the permittivity of the first inorganic insulation layer.

5. The display device of claim 4, wherein the second high permittivity insulation layer is patterned to overlap the second active pattern.

6. The display device of claim 4, wherein a thickness of the second high permittivity insulation layer is less than a thickness of the first inorganic insulation layer.

7. The display device of claim 1, further comprising:
a buffer layer between the substrate and the first active pattern,
wherein the permittivity of the first high permittivity insulation layer is greater than a permittivity of the buffer layer.

8. A display device, comprising:
a substrate;
a first active pattern on the substrate;
a first high permittivity insulation layer on the first active pattern;
a first inorganic insulation layer on the first high permittivity insulation layer;
a second gate insulation layer on the first inorganic insulation layer;
a capacitor electrode on the second gate insulation layer, the capacitor electrode overlapping the first active pattern; and
a first gate electrode between the first inorganic insulation layer and the second gate insulation layer, the first gate electrode overlapping the first active pattern,
wherein a permittivity of the first high permittivity insulation layer is greater than a permittivity of the first inorganic insulation layer, and
wherein the second gate insulation layer comprises a second inorganic insulation layer and a third high permittivity insulation layer having a permittivity greater than a permittivity of the second inorganic insulation layer.

9. The display device of claim 8, wherein the third high permittivity insulation layer is on the second inorganic insulation layer.

10. The display device of claim 8, wherein the third high permittivity insulation layer is patterned to overlap the first gate electrode.

11. The display device of claim 8, wherein a thickness of the third high permittivity insulation layer is less than a thickness of the second inorganic insulation layer.

12. A display device, comprising:
a substrate;
a first active pattern on the substrate;
a first high permittivity insulation layer on the first active pattern;
a first inorganic insulation layer on the first high permittivity insulation layer;
a second gate insulation layer on the first inorganic insulation layer;
a capacitor electrode on the second gate insulation layer, the capacitor electrode overlapping the first active pattern;
an insulation interlayer on the capacitor electrode; and
a source electrode and a drain electrode on the insulation interlayer and connected to the first active pattern,
wherein a permittivity of the first high permittivity insulation layer is greater than a permittivity of the first inorganic insulation layer, and wherein the permittivity of the first high permittivity insulation layer is greater than a permittivity of the insulation interlayer.

13. The display device of claim 12, further comprising:

a planarization layer on the source electrode and the drain electrode;

a first electrode on the planarization layer and connected to the drain electrode;

an emission layer on the first electrode; and a second electrode on the emission layer.

\* \* \* \* \*